United States Patent
Mikalauskas

(10) Patent No.: US 6,710,675 B2
(45) Date of Patent: Mar. 23, 2004

(54) TRANSMISSION LINE PARASITIC ELEMENT DISCONTINUITY CANCELLATION

(75) Inventor: Frank G. Mikalauskas, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 91 days.

(21) Appl. No.: 09/970,550

(22) Filed: Oct. 3, 2001

(65) Prior Publication Data
US 2002/0047092 A1 Apr. 25, 2002

Related U.S. Application Data
(60) Provisional application No. 60/239,020, filed on Oct. 4, 2000.

(51) Int. Cl.[7] .................................................. H03H 7/38
(52) U.S. Cl. ........................................... 333/34; 333/33
(58) Field of Search ................................ 333/1, 33, 34

(56) References Cited

U.S. PATENT DOCUMENTS
5,432,484 A  *  7/1995 Klas et al. ....................... 333/1
6,043,556 A  *  3/2000 Tomie ............................ 257/664
6,133,805 A  * 10/2000 Jain et al. ....................... 333/1

* cited by examiner

Primary Examiner—Robert Pascal
Assistant Examiner—Stephen E. Jones

(57) ABSTRACT

A discontinuity, such as a via, in a signal transmission line can introduce a parasitic element that affects the signal transmission. The method in accordance with the present invention is directed to counteracting the transmission line parasitic element discontinuity. The method includes determining the amount of parasitic capacitance or inductance that is introduced at a portion of the transmission line, such as by the via. A suitable amount of delay is introduced to the transmission line by way of correction impedance in order to counteract the affects of the parasitic element. The delay is calculated taking into account at least in part the correction impedance and the parasitic element effect. The correction impedance is suitably added to a portion of the transmission line at which the parasitic element is present.

12 Claims, 5 Drawing Sheets

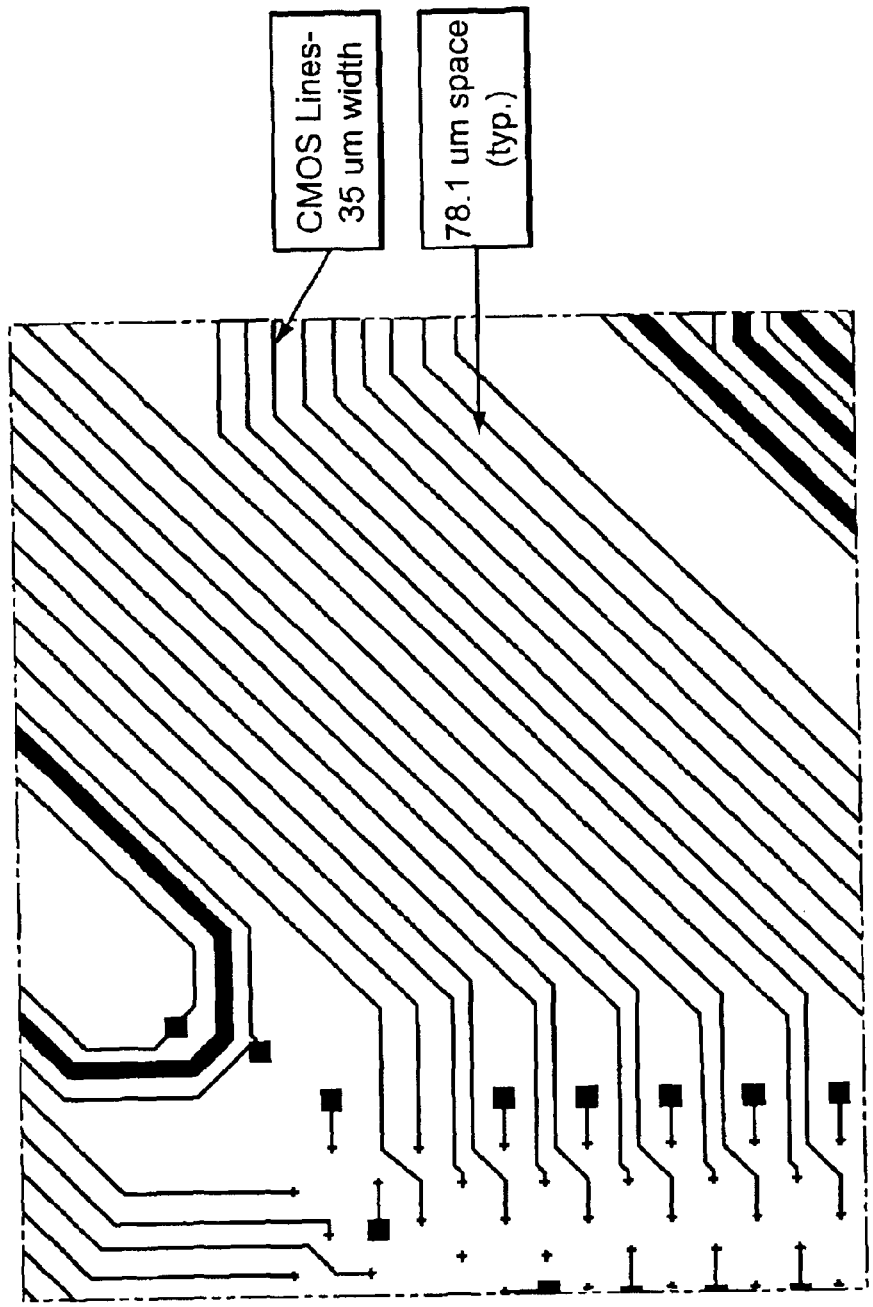

TRANSMISSION LINE PARASITIC ELEMENT DISCONTINUITY CANCELLATION

CLAIM OF PRIORITY

The present application claims the benefit of and incorporates by reference U.S. Provisional Application Serial No. 60/239,020, filed Oct. 4, 2000.

FIELD OF THE INVENTION

The present invention generally relates to the transmission of signals within an electronic device and, more particularly, to a system and method for enhancing the integrity of transmitted signals within an electronic device by canceling the effects of parasitic capacitance in the medium used to transmit signals.

BACKGROUND OF THE INVENTION

Buses are commonly used in computers and other electronic devices to send signals containing data from a driving (or generation) point to any number of receiving points. These busses can be created in printed circuit technology or from cables attached from one point to a second point. Backplane buses use circuit cards that plug in at regular intervals and represent loads along the bus. Cable busses employ cables with uniform electrical parameters that are connected at load devices in, for example, a daisy-chain fashion. Such a connection is used, for example, in Small Computers Systems Interface (SCSI) implementations.

The SCSI type of bus is also adaptable for use within backplane architectures. In systems of this type, the cable bus is replaced with a printed circuit board backplane. Intelligent peripheral devices, in the form of daughter boards, are then connected to the backplane connectors. The backplane architecture provides a compact and efficient method for connecting a series of intelligent peripheral devices to a computer system.

To work properly, a bus must maintain certain electrical characteristics. One of these characteristics is a controlled impedance. For an unloaded bus (i.e., a bus with no attached intelligent peripheral devices), the intrinsic impedance ($Z_0$) can be calculated using the intrinsic impedance per unit length ($L_0$) and the intrinsic capacitance per unit length ($C_0$) in the following equation:

$$Z_0 = (L_0/C_0)^{1/2}$$

For a loaded bus, the preceding equation must be modified to reflect the effect of the attached load devices. This is most always in the form of added capacitance attributable to the attached load devices. Specifically, for a loaded bus the impedance (Z') can be calculated by modifying the preceding equation to include the load capacitance per unit length ($C_d$) resulting in the following equation:

$$Z' = (L_0/(C_0+C_d))^{1/2}$$

Based on this equation, it may be appreciated that increasing the load capacitance per unit length ($C_d$) will result in decreasing values for the loaded impedance (Z'). Unfortunately, in backplane architectures, the buses are relatively short with each load device being separated by a relatively short distance. Since each load device adds capacitance to the bus, there is a tendency for backplane architectures to have relatively high values for load capacitance per unit length ($C_d$). The result is that these architectures may be characterized by low intrinsic low values for impedance (Z'). Low values for impedance (Z') results in a slow propagation speed for signals within the bus. This degrades the performance of the bus, making it more prone to operational errors and electrical noise.

To overcome the degrading effects of decreasing impedance, designers have been faced with a difficult compromise. One possible solution is to increase the length of the bus included in backplane architectures. Typically this is achieved by increasing the effective distance that each signal must travel between adjacent intelligent peripheral devices. Unfortunately, this requires that the size of the backplane be increased or that each signal path be routed in a tortuous pattern between adjacent load devices. The use of a tortuous pattern increases the difficulty of routing the signal paths within the backplane and may require that additional signals layers be added to the backplane. In either case, the cost of the backplane can be increased significantly. Another possible solution is to decrease the clock speed of the bus. Of course, this negatively impacts the performance of the bus, thereby making this solution generally unacceptable.

In addition to the problems discussed above, using RAMBUS technology, current computer data speeds may operate at 800 mega-transfers per second. As a result, the edge rates of the data pulses are on the order of 200 picoseconds or 0.2 nanoseconds. For high speed data ASIC comparisons distortions may occur due to reflections of the data signal from the terminating end of the data signal path. This path may include the path through the silicon itself. Further the silicon path also has parasitic load that must be dealt with.

At these very high speeds (edge rates) the effect of otherwise small reactive components attached to electrical interconnects can have a very detrimental effect. The high speed edge rates of the Rambus-generated signals (e.g., in the Alpha EV7 that uses Rambus signals extensively) would cause significant signal reflections off of parasitic load points such as PWB routing vias or connector pins. Also, the transmission line electrical discontinuities caused by these physical discontinuities (like vias and connector pin metallization) would cause a noise margin reduction of these signals and possible logical failures.

Therefore there is now a need for a high speed bus or signal transmission line that has acceptable electrical signal impedance characteristics and operates at acceptable clock speeds.

SUMMARY OF THE INVENTION

The present invention addresses the aforementioned and related problems that are associated with a parasitic element. Since a discontinuity, such as a via, in a signal transmission line can introduce the parasitic element which affects the signal transmission, the present invention provides a method and system directed to counteracting that transmission line parasitic element discontinuity.

More specifically, in accordance with the purpose of the present invention, as embodied and broadly described herein, the system includes signal transmission line and a correction transmission line. The correction transmission line includes, based on the characteristics of the parasitic element, an inductance or a capacitance. The correction transmission line is positioned in the signal transmission line before or after the parasitic element.

In further accordance with the purpose of the present invention, as embodied and broadly described herein, one method includes determining a value of a parasitic element, be it a capacitive or an inductive parasitic element, that exists at a portion of a signal transmission line which has an impedance. This method also includes calculating a delay associated with a correction impedance of a correction transmission line that, based at least in part on the parasitic element value and the correction impedance of the correction transmission line, is operative to increase the signal transmission line impedance if the parasitic element is capacitive and to decrease the signal transmission line impedance if the parasitic element is inductive. This method further includes adding the correction transmission line to the portion of the signal transmission line at which the parasitic element exists.

In accordance with this method, the correction transmission line is divided equally and each half-part thereof is applied to the signal transmission line. Moreover, the half-parts of the correction transmission line are added one before and one after the parasitic element.

In another embodiment, a method in accordance with the purpose of the present invention enhances signal transmission characteristics of a signal transmission line. This method includes determining an intrinsic capacitance (or inductance) of a parasitic element that exists at a discontinuity portion of a signal transmission line which has an impedance. This method further includes calculating a delay associated with a correction impedance that, based at least in part on the intrinsic capacitance (or inductance) and the correction impedance, is operative to increase the signal transmission line impedance (or decrease the signal transmission line impedance if it is an intrinsic inductance of the parasitic element). Furthermore, this method includes adding the correction impedance to the signal transmission line so that one half of the calculated delay is added before and the other half of the calculated delay is added after the portion of the signal transmission line at which the parasitic element exists.

An advantage of the present invention is that it can eliminate the negative affects of parasitic element discontinuity within an electrical system.

Another advantage of the present invention is that it provides for the precise calculation of operating characteristics that are affected by capacitance cancellation.

Yet another advantage of the present invention is that it controls the impedance and cross talk levels in the ASCI design and incorporates features that cancel out the negative effects of the input capacitance of the silicon die.

Other advantages of the present invention are that it enhances the manufacturing of electrical systems, is cost efficient, and is easy to implement.

Further advantages of the present invention will be understood by those skilled in the art from the description herein. The advantages of the invention will also be realized and attained from practice of the invention disclosed herein.

BRIEF DESCRIPTION OF THE DRAWINGS

The aforementioned and related advantages and features of the present invention will become apparent upon reviewing the following detailed description of the invention, taken in conjunction with the following drawings, where like numerals represent like elements, in which:

FIG. 6 shows another detailed view of the signal paths as determined in accordance with the method of the present invention.

DETAILED DESCRIPTION OF THE INVENTION

Figure 1:
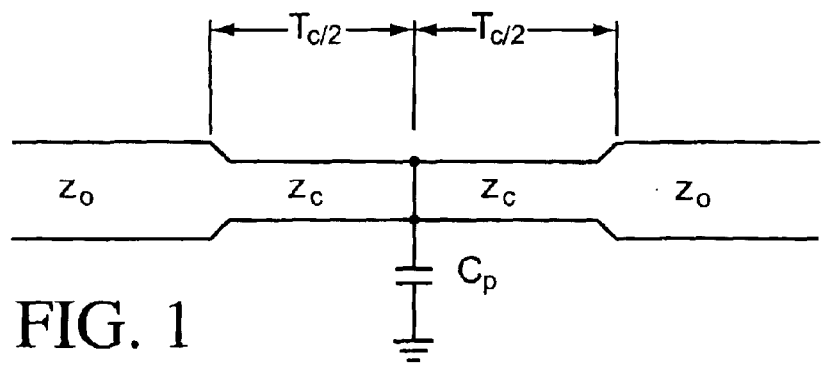
FIG. 1 illustrates correcting the transmission line in order to compensate for parasitic capacitance.

The present invention will now be described with reference to FIGS. 1–7.

The above detailed description of the invention has been provided for the purposed of illustration and description. Although the present invention is described with respect to a specific embodiment, various changes and modifications may be suggested to persons of ordinary skill in the art, and it is intended that the present invention encompass such changes and modifications as they fall within the scope of the claims appended hereto.

The present invention allows for a cancellation (correction) of parasitic elements on a signal transmission line, be they capacitive or inductive, by the use of a length of "correcting" transmission line with a propagation time Tc. The correcting transmission line will have a characteristic impedance, for example Zc, and an intrinsic propagation delay per unit length of Dc (i.e., picoseconds per inch). The parasitic element to be cancelled out or counteracted could be a parallel connected capacitance Cp (such as a stub connected PWB via) or a series connected inductance Ls (such as a series connected PWB via connector pin). The nominal impedance of the signal transmission line is Zo with a nominal delay of Do. The invention allows for a general mathematical solution to calculate the exact amount of transmission line propagation delay of a correcting transmission line to cancel out the impedance discontinuity caused by the reactive parasitic element.

For the correction of a parallel connected parasitic capacitive load the correcting transmission line impedance (Zc) will need to be higher than the normal impedance in the circuit (Zo) and of a delay $Tc=(Zc \cdot Cp)/((Zc/Zo)^2-1)$. For the correction of a parasitic series inductance the correcting impedance Zc will need to be lower than the normal impedance in the circuit and of a delay $Tc=(Ls/Zc)/((Zo/Zc)^2-1)$. When applied properly, the impedance Zc is "loaded down" to Zo by a parasitic capacitance Cp or Zc is "raised up" to Zo by the parasitic inductance Ls. The control of the impedance mismatch comes at a price. There is a known time delay introduced by the correcting transmission line. This will be the value of Tc (the intrinsic unloaded delay of the Zc transmission media) times the ratio of Zc/Zo for capacitive parasitic cancellation or Tc times the ratio of Zo/Zc for inductive parasitic cancellation. This non-intrinsic delay penalty shall be called Tc'. For high frequency applications (fast edge rates) the value of Zc should not be close to Zo to minimize the value of Tc' which should not exceed one-half the edge rate of the signal involved if parasitic cancellation is to be effective.

The correcting transmission line of impedance Zc and delay Dc could be any conveniently allowed transmission line impedance, speed, and form factor (coaxial, twisted, etc.). The general application can be created on a printed wiring board by etching the correcting transmission line at the same time that the normal signal impedance Zo is being etched. The will result in both transmission lines having the same propagation velocity (or unit delay Do) and there will be no additional time or cost involved. Higher impedances for Zc for capacitive parasitic cancellation can be traces etched narrower than the nominal impedance Zo and lower impedances for Zc can be etched wider than the nominal traces. The preferred implementation divides the calculated time of Tc, for the chosen impedance Zc, into two halves. Each half of Tc is placed on either side of the parallel capacitance of the series inductance.

With respect to FIG. 1, it can be seen that the signal path is narrower before and after the parasitic capacitance Cp. The length of each narrow region is Tc/2. Each of the narrow regions has a chosen impedance Zc, while the thick regions of signal path have impedance Zo. Using the formulas as discussed above, the dimensions of the signal transmission path can therefore be customized to eliminate unwanted capacitance. Using conventional integrated circuit package signal transmission path designs, the present invention is able to compensate or eliminate up to 2.5 pF of capacitance for a signal with a rise time of 200 picoseconds.

Figure 2:
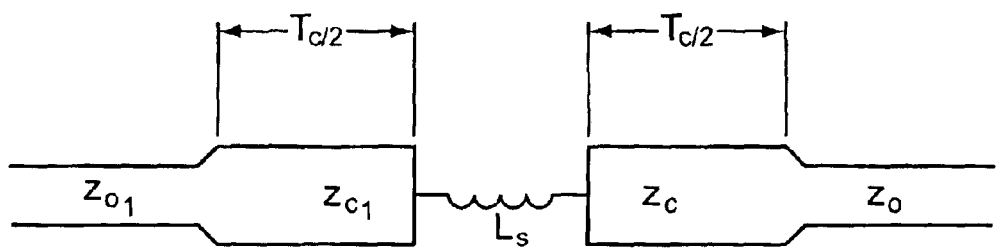
FIG. 2 illustrates correcting the transmission line in order to compensate for parasitic inductance.
Figure 3:
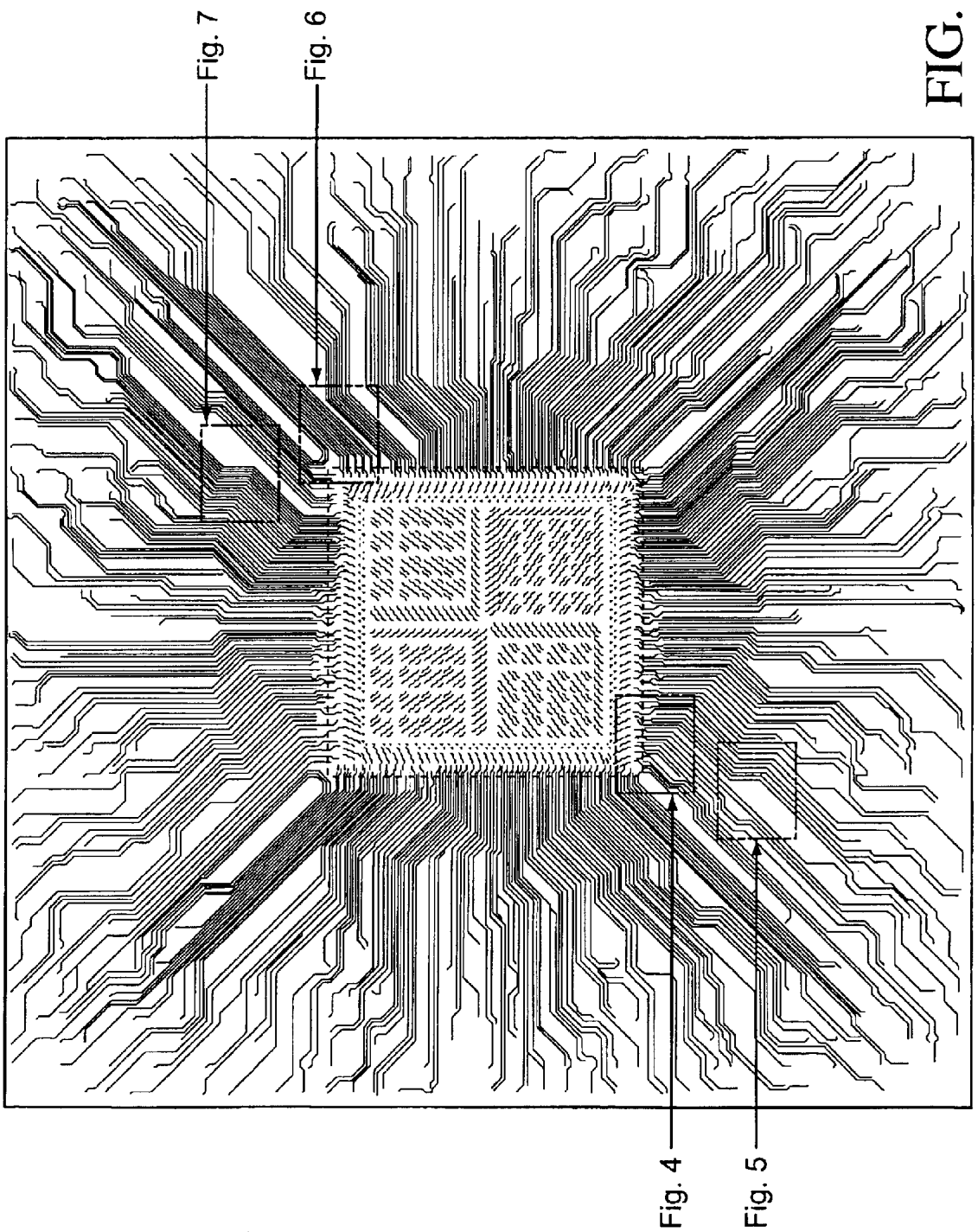
FIG. 3 shows the signal paths as determined in accordance with the method of the present invention.

FIG. 2 shows a signal transmission path that has been designed to eliminate a series inductance Ls. In this example the necessary chosen impedance Zc is less than Zo so the signal path is made wider in the region adjacent both sides of the inductor Ls. Each side of the wide region of signal path is again Tc/2. For example FIG. 3 shows as a solution of the present invention, the custom routing provided in the ASIC package to provide impedance and cross-talk control. A further feature is to have the signals loop through the package so that it enters, brings the signal to the I/O structure of the die and continues on back out of the package toward the terminator mounted on the surface of the PWB. This allows for compensation on both sides of the load. FIG. 3 shows the custom traces required to achieve the nominal Rambus impedance. The wide traces are the Rambus RSL lines and the narrow traces are the "regular" minimum width (35 micron) traces which were used for crosstalk control as well as impedance control. FIGS. 4–7 show close-up or more precise views of the dimensions of these signal line traces.

At the top of the loop, where the flip chip C4 connections are made, there is a parasitic capacitance caused by the ESD diodes as well as I/O transistor structures. With the given impedance levels of the bus, the present invention is able to generate a correction impedance that could cancel out up to 2.5 pf of capacitance. For example, the connections were reduced in width to the 35 micron (minimum) for a length of 3.2 mm to cancel out the 1.8 pf of parasitic capacitance on-chip.

Figure 4:
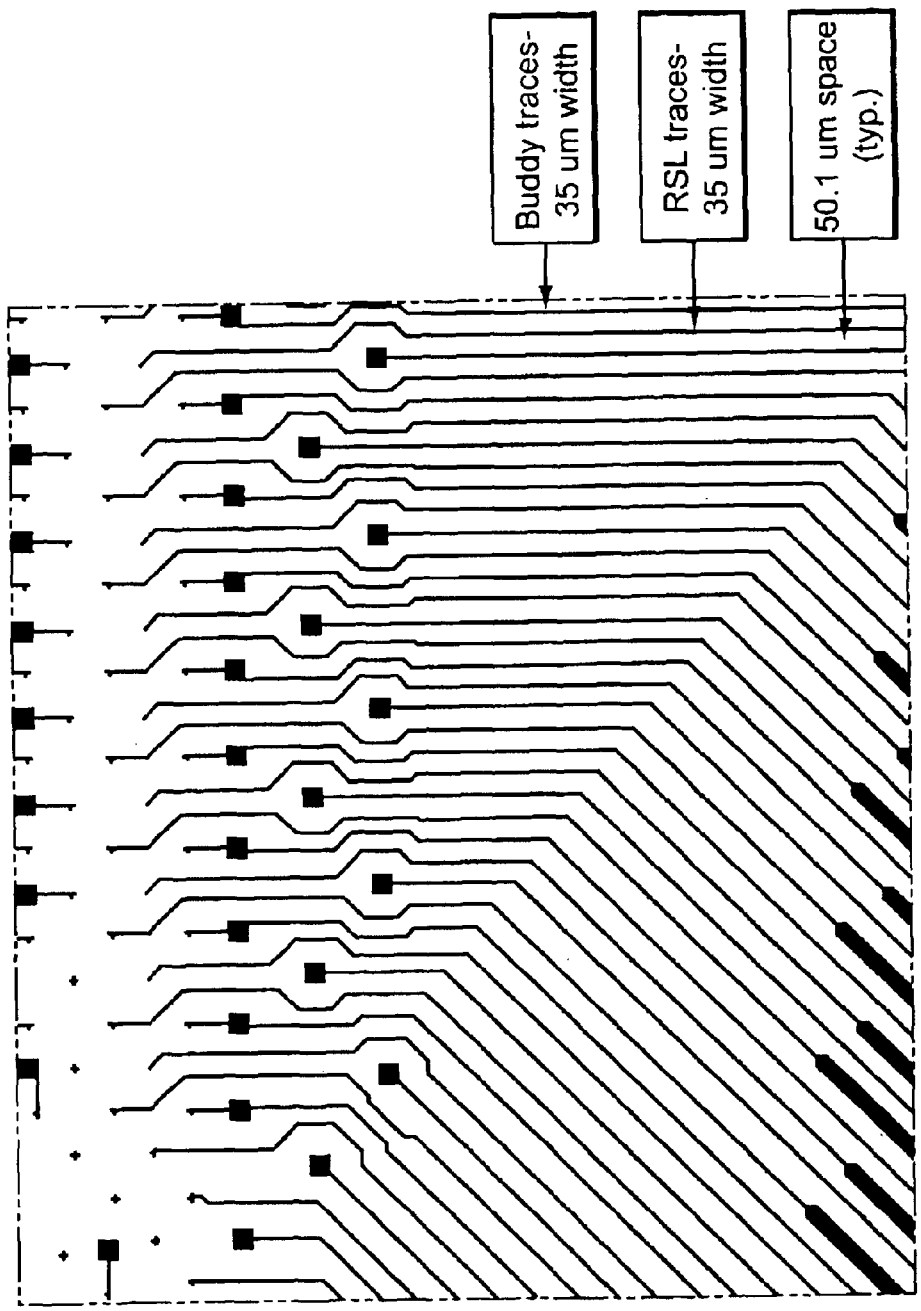
FIG. 4 shows a detailed view of the signal paths as determined in accordance with the method of the present invention.

FIG. 4 shows an example of a close up view of the bus signal paths in FIG. 3. It can be seen in this example that both the RSL traces and "buddy traces" are 35 um in width. The buddy traces act as electrical shields to intercept any crosstalk between adjacent paths. Any stray signals that enter the buddy traces will therefore be sent to ground and not cause distortion. This greatly enhances the integrity of the signals along the bus lines.

Figure 5:
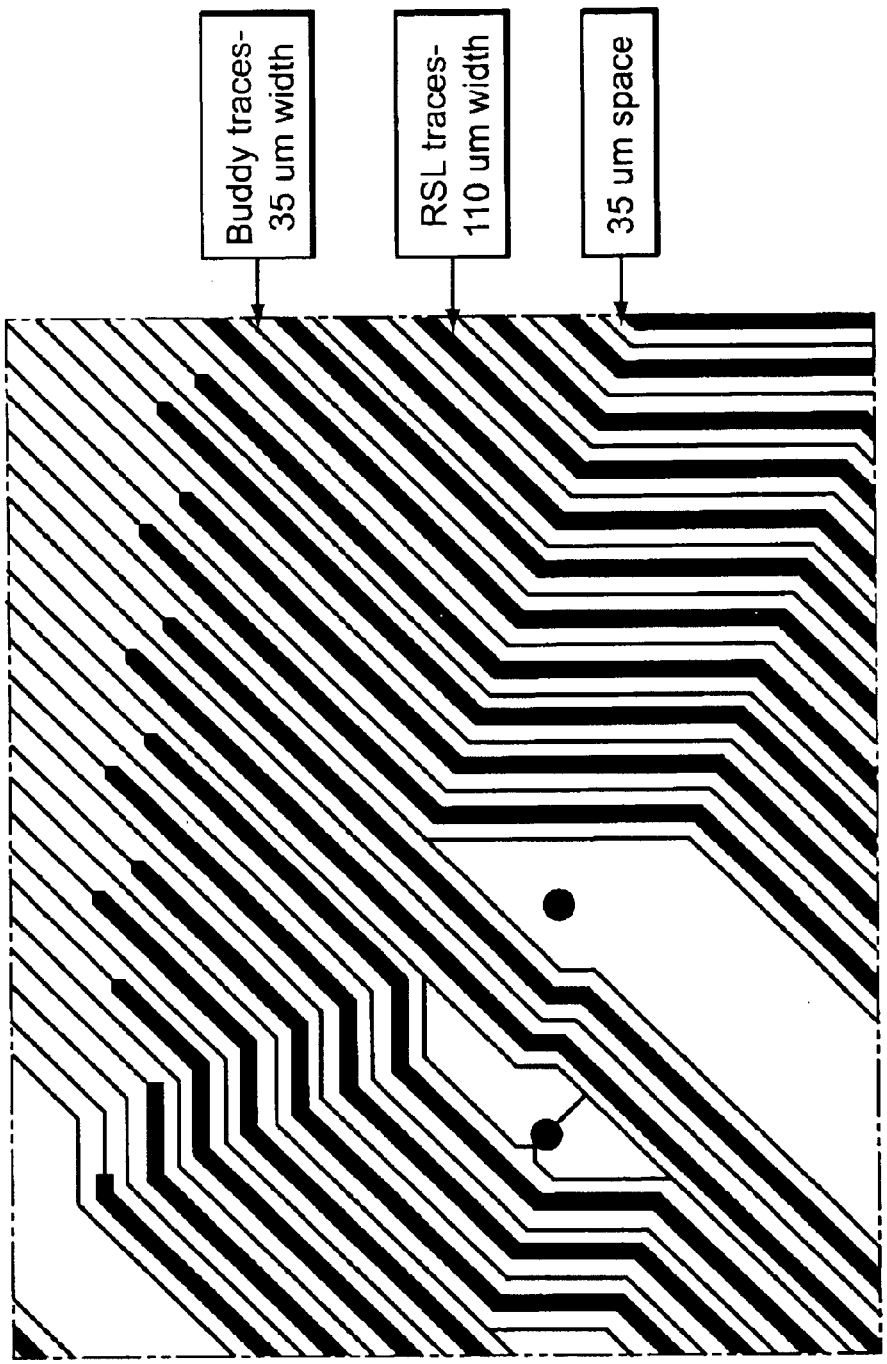
FIG. 5 shows another detailed view of the signal paths as determined in accordance with the method of the present invention.

FIG. 5 also shows a close up view of some signal paths. In this figure it can be seen that the RSL traces are 110 um and the buddy traces are 35 um. This embodiment also shows that the spacing between the buddy traces and the RSL lines to be 35 um. It is also shown that the RSL lines change their width from 110 um to 35 um. It is this changing of signal path widths that embodies the present invention. As also seen in FIG. 4, for a length of 3.2 mm, the signal path just before entering the chip is reduced in width to 35 um.

FIG. 6 shows signal path CMOS lines that are 35 um in width with a spacing of 78.1 urn between CMOS lines.

Figure 7:
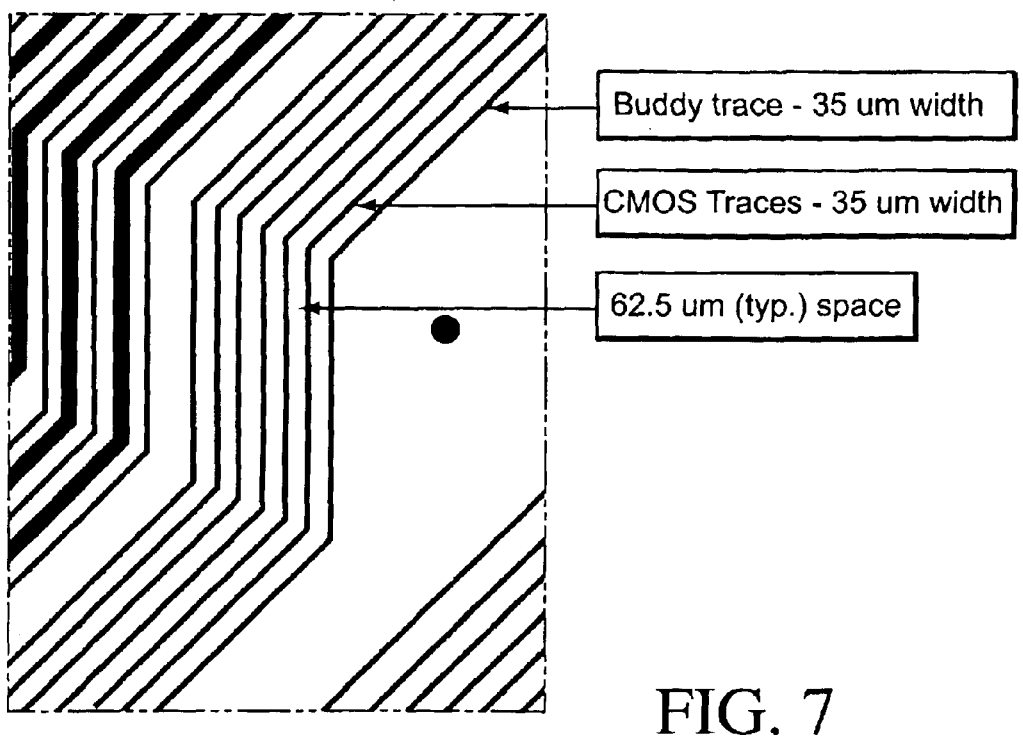
FIG. 7 shows another detailed view of the signal paths as determined in accordance with the method of the present invention.

FIG. 7 shows other CMOS signal paths that have adjacent buddy traces. In this area of the bus, the CMOS lines are 35 um in width with the buddy traces also being 35 um in width. The spacing is shown at 62.5 um in this embodiment.

It is noted that all prior art methods of bus connections do not approach the method taught by the present invention. It is common knowledge that problems with high speed busses existed, however no exact means to compensate for this has been determined until the present invention.

Finally, although the present invention has been described in accordance with the shown embodiments, variations to the embodiments would be apparent to those skilled in the art and those variations would be within the scope and spirit of the present invention. Accordingly, it is intended that the specification and embodiments shown be considered as exemplary only, with a true scope of the invention being indicated by the claims that follow and equivalents.

What is claimed is:

1. A method for counteracting a transmission line parasitic element discontinuity, comprising:
    determining a value of a parasitic element, be it a capacitive or an inductive parasitic element, that exists at a portion of a signal transmission line which has an impedance;
    calculating a delay associated with a correction impedance of a correction transmission line that, based at least in part on the parasitic element value and the correction impedance of the correction transmission line, is operative to increase the signal transmission line impedance if the parasitic element is capacitive and to decrease the signal transmission line impedance if the parasitic element is inductive; and
    adding the correction transmission line to the portion of the signal transmission line at which the parasitic element exists.

2. The method of claim 1, wherein the correction transmission line is divided equally and each half-part thereof is applied to the signal transmission line.

3. The method of claim 2, wherein the half-parts of the correction transmission line are added one before and one after the parasitic element.

4. The method of claim 1, wherein the added correction transmission line counteracts the effects of the parasitic element.

5. The method of claim 1, wherein the correction transmission line causes the impedance of the correction transmission line to match the impedance of the signal transmission line.

6. The method of claim 1, wherein the parasitic element includes a via.

7. A method for enhancing the signal transmission characteristics of a signal transmission line, comprising:
    determining a value of a parasitic element, be it a capacitive or an inductive parasitic element, that exists at a portion of a signal transmission line which has an impedance;
    calculating a delay associated with a correction impedance of a correction transmission line that, based at least in part on the parasitic element value and the correction impedance of the correction transmission line, is operative to increase the signal transmission line impedance if the parasitic element is capacitive and to decrease the signal transmission line impedance if the parasitic element is inductive;

equally dividing the correction transmission line into two halves; and adding the two halves of the correction transmission line to the portion of the signal transmission line at which the parasitic element exists, wherein one half is added before and the other half is added after the parasitic element.

8. A method for enhancing the signal transmission characteristics of a signal transmission line, comprising:

determining an intrinsic capacitance of a parasitic element that exists at a discontinuity portion of a signal transmission line which has an impedance;

calculating a delay associated with a correction impedance that, based at least in part on the intrinsic capacitance and the correction impedance, is operative to increase the signal transmission line impedance; and adding the correction impedance to the signal transmission line so that one half of the calculated delay is added before and the other half of the calculated delay is added after the portion of the signal transmission line at which the parasitic element exists.

9. The method of claim 8 wherein the correction impedance is added by changing the width of the signal transmission line.

10. The method of claim 8, wherein the correction impedance comprises an inductance that is placed before and after the parasitic element.

11. The method of claim 10 wherein the inductance is added by changing the width of the signal transmission line.

12. A method for enhancing the signal transmission characteristics of a signal transmission line, comprising:

determining an intrinsic inductance of a parasitic element that exists at a discontinuity portion of a signal transmission line which has an impedance;

calculating a delay associated with a correction impedance that, based at least in part on the intrinsic inductance and the correction impedance, is operative to decrease the signal transmission line impedance; and adding the correction impedance to the signal transmission line so that one half of the calculated delay is added before and the other half of the calculated delay is added after the portion of the signal transmission line at which the parasitic element exists.

* * * * *